US010446685B2

(12) United States Patent
Mohapatra et al.

(10) Patent No.: US 10,446,685 B2
(45) Date of Patent: Oct. 15, 2019

(54) HIGH-ELECTRON-MOBILITY TRANSISTORS WITH HETEROJUNCTION DOPANT DIFFUSION BARRIER

(71) Applicant: Intel Corporation, Santa Clara, CA (US)

(72) Inventors: Chandra S. Mohapatra, Beaverton, OR (US); Matthew V. Metz, Portland, OR (US); Harold W. Kennel, Portland, OR (US); Gilbert Dewey, Hillsboro, OR (US); Willy Rachmady, Beaverton, OR (US); Anand S. Murthy, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,489

(22) PCT Filed: Sep. 25, 2015

(86) PCT No.: PCT/US2015/052302
§ 371 (c)(1),
(2) Date: Feb. 26, 2018

(87) PCT Pub. No.: WO2017/052609
PCT Pub. Date: Mar. 30, 2017

(65) Prior Publication Data
US 2018/0248028 A1    Aug. 30, 2018

(51) Int. Cl.
*H01L 29/66* (2006.01)
*H01L 29/78* (2006.01)
(Continued)

(52) U.S. Cl.
CPC ........ *H01L 29/785* (2013.01); *H01L 21/0243* (2013.01); *H01L 21/02381* (2013.01);
(Continued)

(58) Field of Classification Search
CPC ............. H01L 29/66462; H01L 29/778; H01L 29/785; H01L 27/0924
See application file for complete search history.

(56) References Cited

U.S. PATENT DOCUMENTS 4,566,025 A * 1/1986 Jastrzebski ............. H01L 21/28
                                                      257/331
8,264,032 B2    9/2012 Yeh
(Continued)

OTHER PUBLICATIONS

International Preliminary Report on Patentability for International Patent Application No. PCT/US15/52299, dated Apr. 5, 2018.
(Continued)

*Primary Examiner* — Mark V Prenty
(74) *Attorney, Agent, or Firm* — Green, Howard, & Mughal LLP

(57) ABSTRACT

III-V compound semiconductor devices, such transistors, may be formed in active regions of a III-V semiconductor material disposed over a silicon substrate. A heterojunction between an active region of III-V semiconductor and the substrate provides a diffusion barrier retarding diffusion of silicon from the substrate into III-V semiconductor material where the silicon might otherwise behave as an electrically active amphoteric contaminate. In some embodiments, the heterojunction is provided within a base portion of a sub-fin disposed between the substrate and a fin containing a transistor channel region. The heterojunction positioned closer to the substrate than active fin region ensures thermal diffusion of silicon atoms is contained away from the active region of a III-V finFET.

18 Claims, 8 Drawing Sheets

(51) Int. Cl.
*H01L 21/02* (2006.01)
*H01L 29/10* (2006.01)
*H01L 27/092* (2006.01)
*H01L 29/778* (2006.01)

(52) U.S. Cl.
CPC .. *H01L 21/02455* (2013.01); *H01L 21/02494* (2013.01); *H01L 21/02538* (2013.01); *H01L 21/02639* (2013.01); *H01L 27/0924* (2013.01); *H01L 29/1054* (2013.01); *H01L 29/66462* (2013.01); *H01L 29/66795* (2013.01); *H01L 29/778* (2013.01)

(56) References Cited

U.S. PATENT DOCUMENTS

| | | | |
|---|---|---|---|
| 8,674,341 | B2 | 3/2014 | Ko |
| 9,653,580 | B2 | 5/2017 | Balakrishnan |
| 2002/0185679 | A1 | 12/2002 | Baliga et al. |
| 2004/0211955 | A1 | 10/2004 | Hsu et al. |
| 2005/0093033 | A1 | 5/2005 | Kinoshita et al. |
| 2007/0090416 | A1 | 4/2007 | Doyle et al. |
| 2009/0108350 | A1 | 4/2009 | Cai et al. |
| 2010/0025771 | A1 | 2/2010 | Hoentschel et al. |
| 2010/0148153 | A1 | 6/2010 | Hudait et al. |
| 2010/0163847 | A1 | 7/2010 | Majhi |
| 2010/0193840 | A1 | 8/2010 | Doyle |
| 2010/0252862 | A1 | 10/2010 | Ko |
| 2011/0133292 | A1 | 6/2011 | Lee |
| 2012/0007183 | A1 | 1/2012 | Chang et al. |
| 2012/0139047 | A1 | 6/2012 | Luo |
| 2012/0248502 | A1 | 10/2012 | Cheng |
| 2013/0056795 | A1 | 3/2013 | Wu et al. |
| 2013/0113051 | A1 | 5/2013 | Cai et al. |
| 2013/0134488 | A1 | 5/2013 | Fumitake |
| 2013/0228875 | A1 | 9/2013 | Lee et al. |
| 2014/0070276 | A1 | 3/2014 | Ko et al. |
| 2014/0084239 | A1 | 3/2014 | Radosavljevic et al. |
| 2014/0175515 | A1 | 6/2014 | Then |
| 2014/0252478 | A1 | 9/2014 | Doornbos et al. |
| 2014/0374841 | A1 | 12/2014 | Wang et al. |
| 2015/0021662 | A1 | 1/2015 | Basu et al. |
| 2015/0093868 | A1 | 4/2015 | Obradovic et al. |
| 2015/0228795 | A1 | 8/2015 | Yang et al. |
| 2015/0236114 | A1 | 8/2015 | Ching et al. |
| 2015/0243756 | A1 | 8/2015 | Obradovic et al. |
| 2015/0255456 | A1 | 9/2015 | Jacob et al. |
| 2015/0255460 | A1* | 9/2015 | Cheng .......... H01L 27/0922 257/351 |
| 2015/0255545 | A1 | 9/2015 | Holland et al. |
| 2015/0255548 | A1 | 9/2015 | Holland |
| 2015/0263138 | A1 | 9/2015 | Kim |
| 2015/0263159 | A1 | 9/2015 | Ching et al. |
| 2016/0005834 | A1 | 1/2016 | Pawlak et al. |
| 2016/0043188 | A1 | 2/2016 | Chu et al. |
| 2016/0204263 | A1 | 7/2016 | Mukherjee et al. |
| 2017/0047404 | A1 | 2/2017 | Bentley et al. |
| 2018/0145077 | A1 | 5/2018 | Dewey et al. |
| 2018/0254332 | A1 | 9/2018 | Mohapatra et al. |

OTHER PUBLICATIONS

International Preliminary Report on Patentability for International Patent Application No. PCT/US15/52345, dated Apr. 5, 2018.
International Preliminary Report on Patentability from PCT/US2015/052302 notified Apr. 5, 2018, 12 pgs.
International Preliminary Report on Patentability from PCT/US2015/052342 notified Apr. 5, 2018, 6 pgs.
Ayers, J.E., "Epitaxy", <http://engr.uconn.edu/~jayers/epitaxy.htm>, online Jun. 15, 2015, 16 pgs.
Huang, C-Y, "III-V Ultra-Thin-Body InGaAs/InAs MOSFETs for Low Standby Power Logic Applications", University of California Santa Barbara, Doctoral Thesis, Sep. 2015, pp. 1-167.
Nahory, R.E., "Band gap versus composition and demonstration of Vegard's law for In1-xGaxAsyP1-y lattice matched to LnP", App. Phys. Lett. 33(7), pp. 659-661, Oct. 1978.
Nahory, R.E, "Enegry-Gap Values for InxGA1-xAs at 300k", The Semiconductors-Information Web-Site, <hhttps://www.semiconductors.co.uk/eg(ingaas).html>, 4 pgs., Dec. 2001.
Porod, W., "Modification of the virtual-crystal approximation for ternary III-V compounds", Phys. Rev., B27, No. 4, pp. 2587-2589, Feb. 15, 1983.
International search Report and Written Opinion for International Patent Application No. PCT/US2015/052299, dated Jun. 15, 2016.
International Search Report and Written Opinion for International Patent Application No. PCT/US2015/052345, dated Jun. 20, 2016.
International Search Report and Written Opinion, dated Jun. 15, 2016 for PCT Patent No. PCT/US15/52302.
International Search Report and Written Opinion from PCT/US2015/052342 notified Jun. 15, 2016, 9 pgs.

* cited by examiner

HIGH-ELECTRON-MOBILITY TRANSISTORS WITH HETEROJUNCTION DOPANT DIFFUSION BARRIER

CLAIM OF PRIORITY

This Application is a National Stage Entry of, and claims priority to, PCT Application No. PCT/US2015/052302, filed on Sep. 25, 2015 and titled "HIGH-ELECTRON-MOBILITY TRANSISTORS WITH HETEROJUNCTION DOPANT DIFFUSION BARRIER", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, including compound semiconductor materials (e.g., GaAs, InP, InGaAs, InAs, and III-N materials). These non-silicon material systems may be employed in high electron mobility transistors (HEMT), some of which may be metal oxide semiconductor field effect transistors (MOSFET).

One technique for fabricating high electron mobility transistors includes forming a non-silicon crystalline device region (e.g., a transistor channel region) over a crystalline silicon substrate. One problem however is that silicon atoms from the underlying substrate can act as a contaminant within non-silicon device regions. Techniques and structures to mitigate the problem of silicon contamination are therefore advantageous in the fabrication of HEMTs on silicon substrates.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
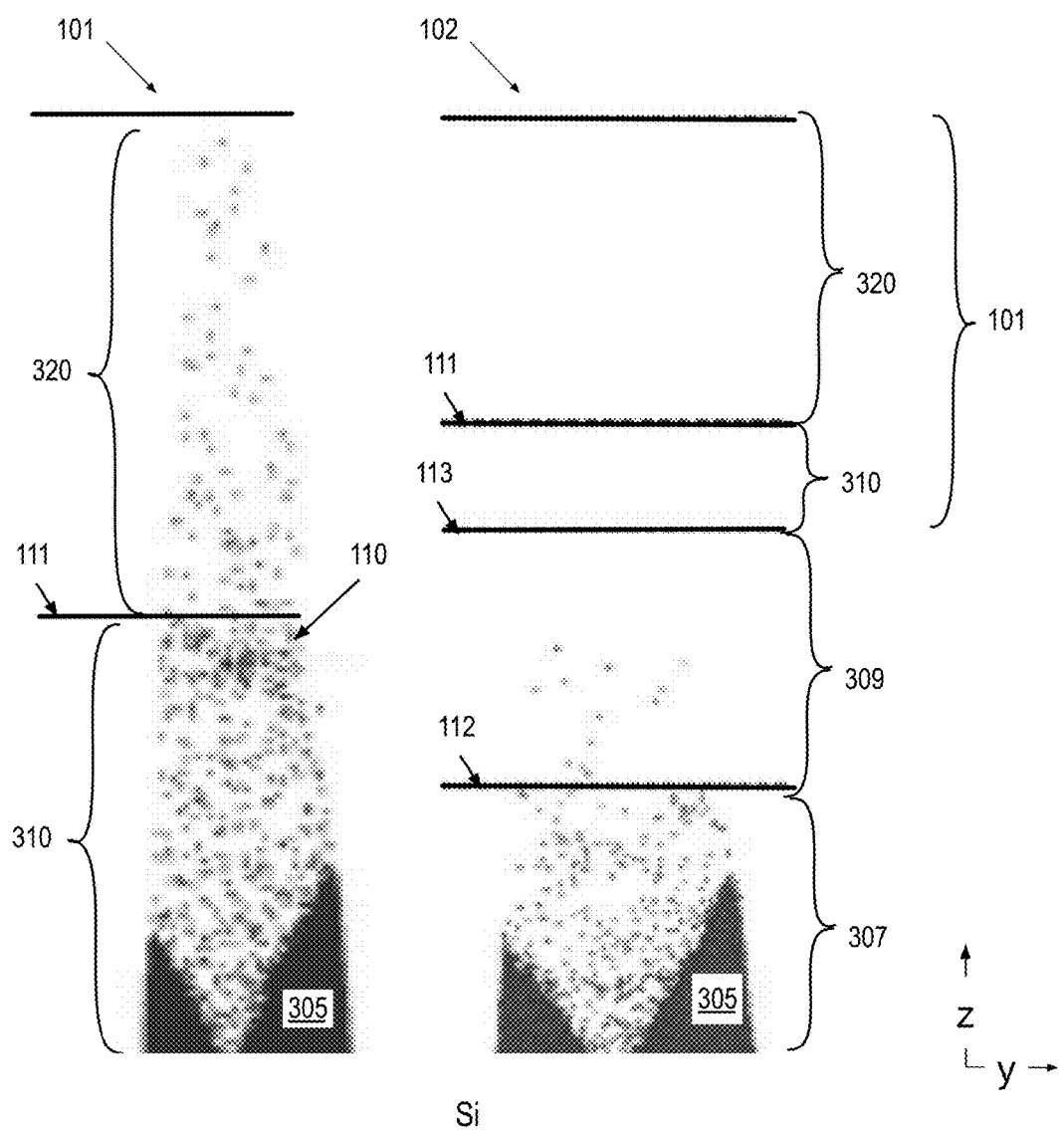
FIG. 1 is an atomic probe tomogram illustrating how inserting a heterojunction within a III-V material stack impacts silicon contamination within the stack, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are exemplary embodiments of heteroepitaxial structures including an elevated crystalline III-V structure extending over a crystalline silicon substrate. Using heteroepitaxial growth techniques to form the III-V structures, non-silicon devices (e.g., III-V channel field effect transistors), may be formed in raised structures extending over a first region of a silicon substrate. Silicon devices (e.g., silicon channel field effect transistors) may be formed in other regions of the silicon substrate.

Notably for III-V devices on silicon substrates, thermal transitions associated with various processes in semiconductor manufacturing tend to drive Si atoms from the underlying substrate into the non-silicon device region. Silicon atoms are an amphoteric dopant in most III-V materials, and often preferentially dope the III-V materials n-type. Under some circumstances such unintentional solid-state diffusion-based doping of III-V material may be acceptable or even advantageous. For example, having an n-type doped III-V material between the active region and the substrate may be desirable in a PMOS transistor, for example improving electrical isolation of the active region. However, for a III-V NMOS transistor, an underlayer unintentionally doped n-type through silicon contamination could create an electrical path between the source/drain leading to very high off-state current $I_{off}$. With transistor critical dimensions continuing to scale down, even a slight unintentional n-type doping of III-V material adjacent to the active region (e.g., channel and/or source/drain regions) can degrade NMOS device performance dramatically.

Although counter-doping any III-V material between an active device region and silicon substrate with acceptor impurities promoting p-type conductivity might prevent the presence of silicon contamination from dictating the electrical conductivity type of the III-V material (i.e., relegating the silicon contamination to a background level), such an effort poses a substantial risk of thermally diffusing the various impurities into the channel region, eventually reducing the channel mobility. Such a counter-doping strategy may then only be successful for long channel devices.

The inventors have found that thermal diffusion of dopant atoms, such as silicon donors, may be arrested or at least significantly retarded by inserting one or more heterojunction within the III-V material disposed between an active transistor region and the substrate. In some embodiments therefore, a portion of the III-V material, distal from the active area, is compositionally modulated to form a dopant diffusion barrier. In exemplary embodiments with a type-I band offset, a narrower band gap material is disposed between a wider band gap III-V material and the silicon dopant source (e.g., a silicon substrate). The heterojunction between the narrower and wider band gap III-V materials has been found to function as a diffusion barrier retarding diffusion of silicon atoms from the substrate into substantially un-doped regions of the III-V material disposed on a side of the wider band gap III-V material opposite the substrate. Silicon atoms diffused from the substrate will then be in a higher concentration within the narrower band gap material. III-V material on a side of the heterojunction opposite the substrate has significantly lower dopant atom concentration, and may be substantially undoped (i.e., below detection limits). Notably, with the function of the III-V heterojunction being a diffusion barrier, the III-V heterojunction is advantageously near the substrate and ideally nearer the substrate than the active region to contain silicon impurities to a minor portion of the III-V material stack thickness. Thus, rather than attempting to counter the electrical effects of silicon diffusion proximal to an active region, heterojunction engineering is employed to retard silicon diffusion at a point distal from the active region, keeping the remainder of the III-V material more pure. The end result is an active region with high mobility and a device with lower off-state leakage current.

In some embodiments, a silicon diffusion barrier comprises a III-V heterojunction between a first III-V material associated with a first band gap and a second III-V material associated with the second band gap. In some advantageous embodiments the difference in band gap further entails a conduction band offset (CBO) of at least 250 meV with the second III-V material having a conduction band or higher energy than the first III-V material and physically separated from the substrate by the first III-V material. Larger offsets are also possible (e.g., 350 meV, or more).

FIG. 1 is an atomic probe tomogram illustrating a reduction in silicon contamination by inserting a heterojunction within the stack in accordance with some embodiments impacts. In FIG. 1, dot density illustrates silicon concentration with higher dot density associated with higher silicon concentration. Two III-V material stacks 101 and 102 are illustrated side-by-side with approximately matched z-heights (associated with material thicknesses), and each following a same thermal treatment. Reference III-V material stack 101 includes a first III-V material layer 310 disposed over a silicon substrate 305. A second III-V material layer 320 having a different III-V alloy composition than III-V material layer 310 forms a heterojunction 111. In III-V material stack 101, III-V material layer 310 is of an alloy composition having a conduction band energy greater than that of III-V material layer 320, and in some examples is a wider bandgap material. III-V material layer 310 may have a CBO of a few hundred meV, or more, from III-V material layer 320. While such an arrangement may pose certain advantages associated with containing charge carriers (e.g., electrons) within an active area disposed within III-V material layer 320, it can be seen that a significant silicon concentration (e.g., 1-1.5e19 silicon atoms/cm$^3$) extends throughout the material layers in stack 101 with some silicon atom pile up 110 proximate to heterojunction 111. Because silicon impurities in III-V material layer 320 potentially lower carrier mobility, and silicon impurities within III-V material layer 310 potentially increase leakage if electrically activated as n-type donors, a transistor employing III-V material stack 101 may display less than ideal characteristics (e.g., $I_{off}$ and $I_{on}$).

In comparison, an exemplary III-V material stack 102 includes a heterojunction-based dopant diffusion barrier in accordance with some embodiments. Stack 102 includes first III-V material layer 307 disposed over silicon substrate 305. In some embodiments, III-V material layer 307 is a first of: GaAs, GaAsSb, AlAsSb, InAs, InGaAs, InAlAs, InAlGaAs, AlGaAs, InP, GaP, AlAs, or InGaP. A second III-V material layer 309, having a different III-V alloy composition than III-V material layer 307, forms a heterojunction 112. In some embodiments, III-V material layer 309 is a second of: GaAs, GaAsSb, AlAsSb, InAs, InGaAs, InAlAs, InAlGaAs, AlGaAs, InP, GaP, AlAs, or InGaP. In III-V material stack 102, III-V material layer 309 is of an alloy composition having a conduction band energy higher than that of material layer 307. In some exemplary embodiments with a type-I band offset, material layer 309 has a wider bandgap than that of III-V material layer 307. For example, an AlAs or AlGaAs material layer 309 may be disposed on a GaAs material layer 307. In another example, an InP material layer 309 is disposed on InGaAs material layer 307. In exemplary embodiments, III-V material layer 309 is of an alloy having a CBO from that of III-V material layer 307 of at least 250 meV, and advantageously 350 meV, or more. Relative to substrate 305 therefore, heterojunction 112 is inverted from heterojunction 111. Notably, silicon concentration declines precipitously at heterojunction 112. For example, with the concentration of silicon impurities within III-V material layer 307 being mid-e19 silicon atoms/cm$^3$, silicon impurity concentration drops to low e18 silicon atoms/cm$^3$ within III-V material layer 309.

With proper selection of the III-V material layer 307, the desired conduction band offset may be provided in combination with other heterojunctions. For example, material stack 102 further includes a third III-V material layer 310 having a different III-V alloy composition than that of III-V material layer 309. In some embodiments, III-V material layer 310 is one of: GaAs, GaAsSb, AlAsSb, InAs, InGaAs, InAlAs, InAlGaAs, AlGaAs, InP, GaP, AlAs, or InGaP. In some advantageous embodiments, III-V material layer 310 is of an alloy composition having lower conduction band energy than that of III-V material layer 309, and may further have a narrower bandgap than that of III-V material layer 309. For example, an AlGaAs or GaAs material layer 310 may be disposed on an AlAs material layer 309, or an InGaAs material layer 310 may be disposed on an InP material layer 309. In the exemplary embodiment, III-V material layer 310 has a CBO of a few hundred meV, or more, from that of III-V material layer 309. In some embodiments, III-V material layer 310 has the same III-V alloy composition as III-V material layer 307. For example, a GaAs material layer 310 is disposed on an AlAs material layer 309 that is disposed on a GaAs material layer 307, an AlGaAs material layer 310 is disposed on an AlAs material layer 309 that is further disposed on a AlGaAs material layer 307. As another example, an InGaAs material layer 310 may be disposed on an InP material layer 309 that is further disposed on an InGaAs material layer 307.

A fourth III-V material layer 320 having a different III-V alloy composition than III-V material layer 310 forms heterojunction 111. In some embodiments, III-V material layer 320 is one of: GaAs, GaAsSb, AlAsSb, InAs, InGaAs, InAlAs, InAlGaAs, AlGaAs, InP, GaP, AlAs, or InGaP. In exemplary embodiments, III-V material layer 320 is of a material having a high charge carrier mobility and with a CBO relative to III-V material layer 310 that will block charge carriers from transiting toward the substrate. In some embodiments, III-V material layer 320 is of an alloy composition having a lower conduction band energy than that of III-V material layer 310. III-V material layer may further have a narrower bandgap than that of III-V material layer 310. For example, an InGaAs fin (e.g., In0.53Ga0.47As) is well-suited to a InP/InGaAs sub-fin, and may also be suitable for a GaAs/AlAs sub-fin, etc. As such, III-V material stack 102 may include III-V material stack 101 disposed over the additional heterojunctions 112 and 113 inserted below the material stack 101. For embodiments where III-V material layer 310 has the same III-V alloy composition as III-V material layer 307, III-V material stack 102 may be described as including III-V material stack 101 with wide band gap material 309 inserted within III-V material layer 310.

As shown in FIG. 1, III-V material layers 310 and 320 silicon contamination is below the detection limit of the APT measurement technique (e.g., less than 1e18 silicon atoms/cm$^3$). Notably, even at heterojunction 111, associated with silicon pile up 110 in material stack 101 has a silicon atom concentration within material stack 102 that remains below 1e18 atoms/cm$^3$.

FIG. 1 illustrates the efficacy of band gap engineering silicon diffusion barriers. The technique or methodology may be further combined with other techniques, for example to bolster the diffusion barrier and/or reduce a total thickness of a III-V material stack needed to implement an adequate barrier. Although not bound by theory, it is currently understood that silicon donor atoms may diffuse through III-V semiconductor material by way of negatively charged vacancies, the quantity of which can be reduced through counter-doping with acceptor impurities (e.g., C, Zn, Be, or Mg). In some embodiments therefore, only a base portion of the III-V material, far from the active area, is counter-doped. This counter-doped region functions as an additional diffusion barrier further retarding diffusion of silicon from the substrate into substantially un-doped regions of the III-V material near the active region. In some embodiments, a first III-V material layer associated with the heterojunction diffusion barrier (e.g., III-V material layer 307 in FIG. 1) is counter-doped to an impurity concentration over 1e18 atoms/cm$^3$, and advantageously at least 5e18 atoms/cm$^3$. In some exemplary NMOS finFET embodiments, counter-doping is no more than 1e19 atoms/cm$^3$. These levels of counter-doping should avoid compromising short channel transistor performance if the counter-dopant species thermally diffuses from the diffusion barrier and into an active (channel) region. Hence, either the counter-doped III-V material thickness is increased or the location of the barrier relative to the channel is increased in order to accommodate device scaling etc.

Thicknesses of III-V material layers implementing a heterojunction-based diffusion barrier may vary. In advantageous embodiments the heterojunction implementing the diffusion barrier (e.g., heterojunction 112 in FIG. 1) is nearer to the source of the dopant impurity (e.g., silicon substrate) than the barrier is to the active region. In such a location, the diffusion barrier can maintain a majority of the III-V material stack at a lower impurity dopant levels, which will favor high carrier mobility and low leakage.

The embodiments described above are applicable for a wide area of devices and integrated circuitry implemented in a III-V material system disposed on a silicon substrate. Similar strategies may also be employed for other material systems heteroepitaxially grown on a silicon substrate (e.g., GaN-on-silicon, etc.). The principles and methodologies introduced above are further illustrated below in the context of exemplary field effect transistor (FET) embodiments utilizing semiconductor fin structures (i.e., finFETs). However, one of ordinary skill may readily apply these teachings equally well to other transistor designs (e.g., heterojunction bipolar transistors), other transistor geometries (e.g., planar transistors, or nanowire transistors). The principles and methodologies introduced above and expounded in finFET embodiments herein may also be applied to other microelectronic devices such as, but not limited, electro-optical devices (e.g., III-V photodetectors).

Figure 2:
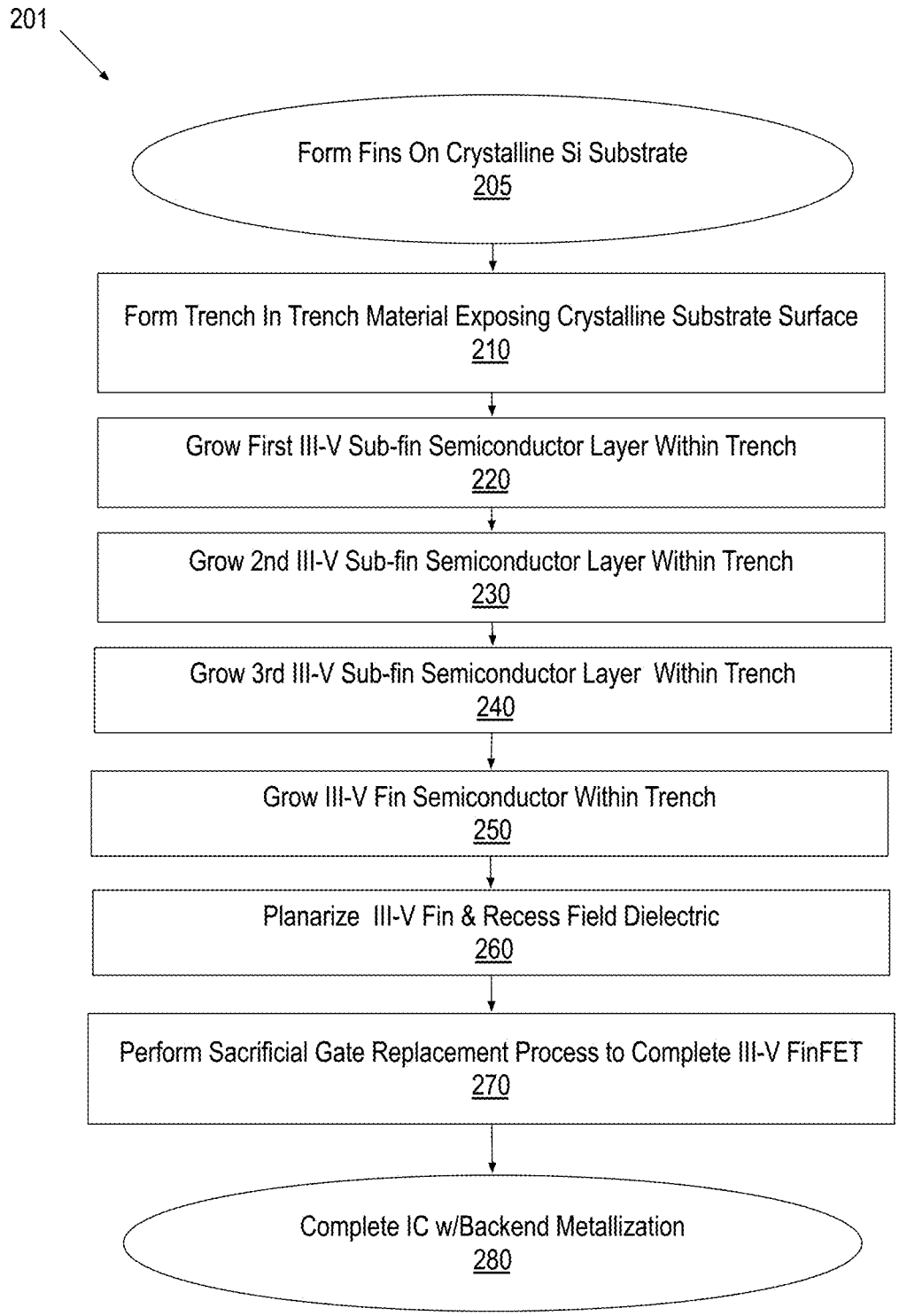
FIG. 2 is a flow diagram illustrating a method of forming a III-V transistor with a sub-fin heterojunction-based dopant diffusion barrier, in accordance with some embodiments.

A variety of methods and/or techniques may be employed to fabricate FinFETs in III-V material on a silicon substrate to include a heterojunction-based silicon diffusion barrier in accordance with one or more embodiments. FIG. 2 is a flow diagram illustrating an exemplary method 201 for forming a III-V transistor with a sub-fin silicon diffusion barrier, in accordance with some embodiments. FIGS. 3A, 3B, 3C, 3D, and 3E are isometric views illustrating a pair of fin structures evolving as operations in the method 201 are performed, in accordance with some embodiments.

In some exemplary embodiments, aspect ratio trapping (ART) is utilized to achieve acceptable crystal quality in heteroepitaxial III-V fin material. The ART technique described herein in the context of method 201 is an example of additive heteroepitaxial fin fabrication, which may advantageously reduce the effects of lattice mismatch across various heterojunctions within a given III-V material stack. In alternative embodiments, a conventional subtractive technique may be employed in which a blanket epitaxial film stack is grown over a silicon substrate and a heterojunction is introduced as a silicon diffusion barrier at an appropriate point in the growth of the blanket film stack. The blanket material would then be patterned into transistor structures (e.g., finFETs) using any known technique.

In reference to FIG. 2, at operation 210 a trench is formed in a dielectric material disposed over the silicon substrate. The trench may be patterned completely through a z-thickness of the dielectric material, exposing a crystalline silicon substrate surface that is to seed a subsequent epitaxial growth of III-V material. In the exemplary embodiment illustrated in FIG. 3A, operation 210 further entails forming fins on a crystalline silicon substrate. Any silicon fin patterning process may be employed to arrive at a plurality of silicon fins 306 extending from silicon substrate 305. Although not depicted, in some advantageous embodiments, silicon substrate 305 is further employed in the fabrication of any known silicon-channeled MOSFETs (e.g., as PMOS devices for monolithic integration of III-V MOS transistors to enable CMOS integrated circuitry). Crystallographic orientation of a substantially monocrystalline substrate 305 in exemplary embodiments is (100), (111), or (110). However, other crystallographic orientations are also possible. For example, the substrate working surface may be miscut, or offcut 2-10° toward [110], to facilitate nucleation of heteroepitaxial sub-fin material 110. Other substrate embodiments are also possible, with examples including silicon-carbide (SiC), a silicon on insulator (SOI) substrate, or silicon-germanium (SiGe).

Figure 3A:
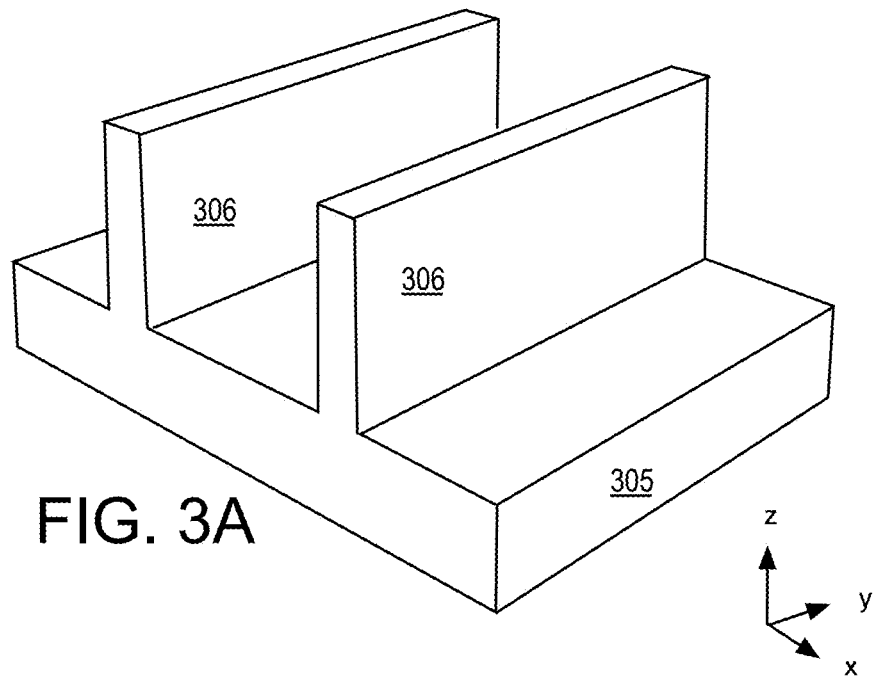
FIGS. 3A, 3B, 3C, 3D, and 3E are isometric views illustrating a pair of fin structures evolving as operations in the method depicted in FIG. 2 are performed, in accordance with some embodiments.
Figure 3B:
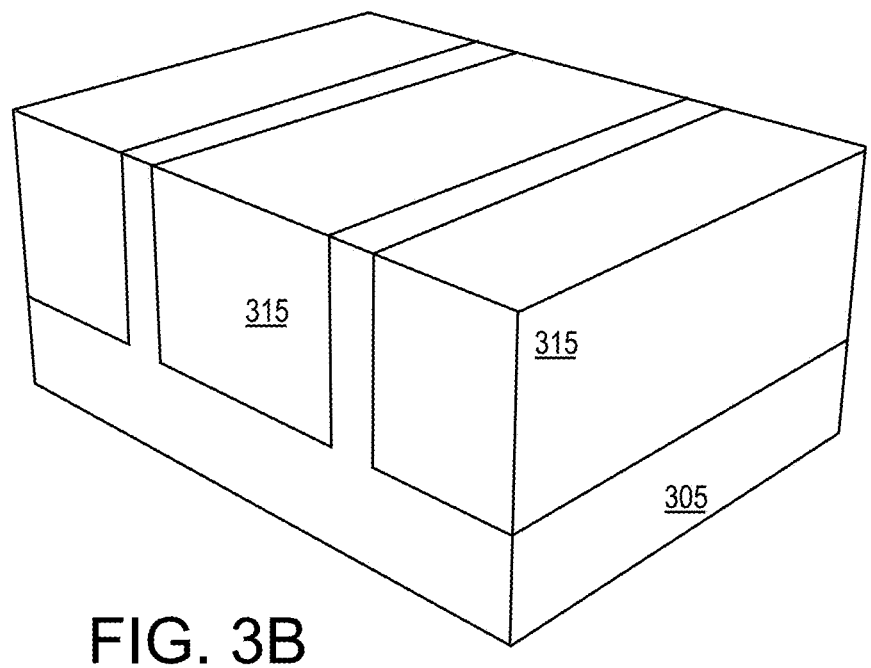
Figure 3C:
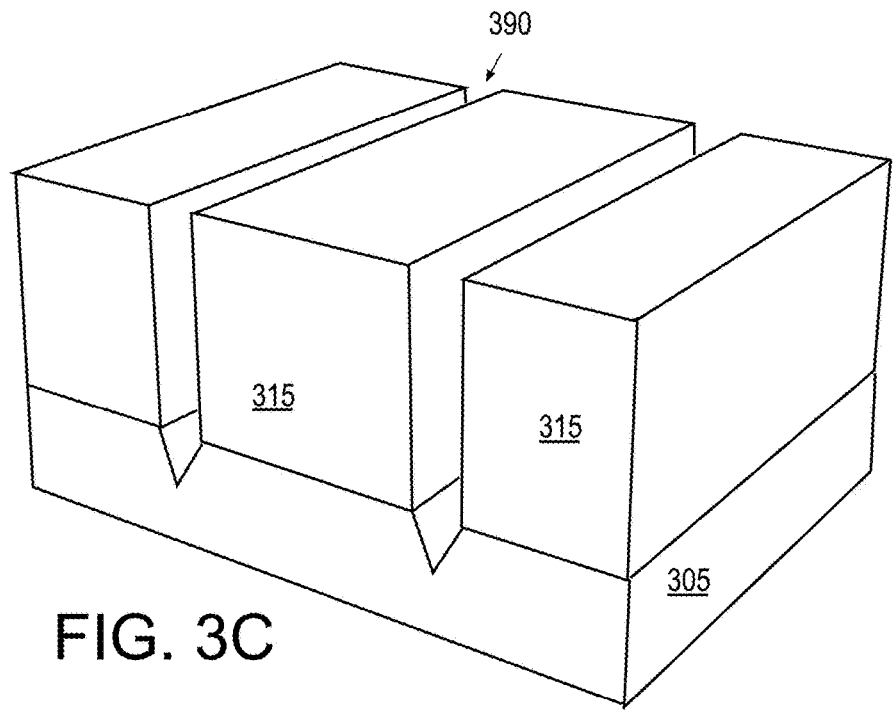

As further illustrated in FIG. 3B, a field dielectric material 315 is deposited over silicon fins 306, and planarized with a top surface of fins 306. Dielectric material 315 may be any dielectric material known suitable as a field isolation or shallow trench isolation (STI) material, such as, but not limited, to silicon dioxide. As further illustrated in FIG. 3C, silicon fins 306 are etched selectively relative to dielectric material 315, forming trench 390 exposing a portion of substrate 305. In some embodiments, the exposed portion of substrate 305 is recessed etched. In the illustrated example, a recess with positively sloped sidewalls is etched into substrate 105, which may further enhance trapping of crystalline defects (e.g., dislocations) in a subsequently grown crystalline sub-fin material. In some embodiments, where silicon substrate 305 is (100) silicon, a crystallographic wet etch is employed to remove silicon fins 306 and/or facet substrate 305 exposing (111) planes within the etched recess. The (111) planes may provide a better lattice match with III-V material, improving the quality of subsequently grown crystalline III-V material and reducing anti-phase boundary induced defects. But, other facet geometries could also be possible.

Although dimensions of trench 390 may vary, the aspect ratio (z-depth:y-dimension) is advantageously at least 2:1 and more advantageously 3:1, or more. In some embodiments, trench 390 has a smallest lateral critical dimension (CD) between 10 and 200 nm. However, trench material z-thickness and CD may be scaled as needed to maintain a workable aspect ratio for a predetermined fin height selected for a desired transistor current carrying width, etc.

Returning to FIG. 2, method 201 continues with embedding in a field dielectric a III-V sub-fin including a heterojunction diffusion barrier. At operation 220 a first thickness of substantially monocrystalline III-V semiconductor is epitaxially grown from the silicon substrate surface (or from a seed layer grown thereon) exposed at the bottom of the trench formed at operation 210. The term "substantially" monocrystalline is employed to acknowledge that any number of crystalline defects may be present, but will tend to be trapped at the edges of the trench. In some embodiments, operation 220 entails epitaxially growing a first layer of III-V semiconductor material such as, GaAs, GaAsSb, AlAsSb, InAs, InGaAs, InAlAs, InAlGaAs, AlGaAs, InP, GaP, AlAs, or InGaP. Any epitaxial growth technique, such as, but not limited to, metal-organic chemical vapor deposition (MOCVD), molecular beam epitaxy (MBE), or hydride vapor phase epitaxy (HVPE) may be utilized at operation 220. In exemplary embodiments, III-V material is epitaxially grown selectively on the substrate/seeding surface to partially back fill trench 390. At operation 220, feed gases and potentially other epitaxial process control parameters (e.g., temperature, partial pressures, etc.) are set to supply a first III-V alloy composition. In exemplary embodiments, the first III-V semiconductor material is one that can be rapidly modulated to a new composition that will have a significantly larger band gap and/or CBO. In one embodiment, a binary alloy, such as but not limited to GaAs, InGaAs, or AlGaAs, is grown at operation 220. Tertiary and quaternary III-V alloys may be grown as well. In some further embodiments, one or more source containing C, Zn, Be, or Mg is provided to in-situ dope the III-V epitaxial material p-type to a desired impurity concentration (e.g., to reduce silicon diffusivity within the first III-V material layer grown at operation 220). The first sub-fin III-V semiconductor material grown at operation 220 may be relatively thin to advantageously place the heterojunction diffusion barrier as close to the silicon source (e.g., substrate) as possible. For example, in some exemplary embodiments, the first sub-fin III-V semiconductor material is grown to a thickness no more than 100 nm, and advantageously 50 nm, or less.

At operation 230, feed gases and potentially other epitaxial process control parameters (e.g., temperature, partial pressures, etc.) are changed to compositionally modulate the III-V material composition and grow a second layer off III-V material associated with a wider band gap and/or CBO than that of the first layer of III-V material. In some advantageous embodiments, the wider band gap is associated with a CBO offset between the first and second sub-fin layers that is at least 250 meV. The CBO offset may be larger (e.g., 350 meV, or more). In some advantageous embodiments, the change in III-V alloy composition between the first and second sub-fin layers occurs abruptly, for example over a material thickness of no more than 10 nm. If the first III-V material layer grown at operation 220 included a counter-dopant the counter-doped source is also eliminated at operation 230 to grow a second thickness of substantially undoped (i.e., not intentionally doped) III-V material from the surface of the first sub-fin III-V material contained within the trench. Operations 220 and 230 may be performed in a continuous manner with an in-situ change in growth parameters. In some embodiments, operation 230 entails epitaxially growing a second thickness of III-V semiconductor material such as, GaAs, GaAsSb, AlAsSb, InAs, InGaAs, InAlAs, InAlGaAs, AlGaAs, InP, GaP, AlAs, or InGaP, determined as a function of the composition of the first material layer grown at operation 220. In one exemplary embodiment, where the first III-V material layer is GaAs, InGaAs, or AlGaAs, operation 230 entails growing an AlGaAs or AlAs material layer. The second sub-fin III-V semiconductor material may be grown to a wide range of thicknesses. Thicknesses may be constrained to some predetermined target to arrive at a desired final hetero-fin height. In some exemplary embodiments, the second sub-fin III-V semiconductor material is grown to a thickness no more than 100 nm and advantageously 50 nm, or less.

With the heterojunction diffusion barrier in place, method 201 continues at operation 240, where feed gases and potentially other epitaxial process control parameters (e.g., temperature, partial pressures, etc.) are changed to epitaxially grow a third III-V sub-fin material layer from a surface of the second III-V sub-fin material layer contained within the trench. Operations 230 and 240 may be performed in a continuous manner with an in-situ change in growth parameters. In some embodiments, operation 240 entails heteroepitaxially growing a third thickness of III-V semiconductor material such as GaAs, GaAsSb, AlAsSb, InAs, InGaAs, InAlAs, InAlGaAs, AlGaAs, InP, GaP, AlAs, or InGaP. In some exemplary embodiments, the same material grown at operation 220 is grown at operation 240 (e.g., GaAs, GaAs, InGaAs, or AlGaAs). As such, the multiple III-V materials form a sub-fin structure with at least two heterojunctions. In advantageous embodiments, operation 240 is performed without intentional doping, to grow III-V material with lowest possible impurity doping. The third sub-fin III-V semiconductor material may be grown to a wide range of thicknesses as the material may be employed to provide a third heterojunction with a subsequently grown III-V fin material in which an active device region is to reside. Thicknesses of the third sub-fin III-V semiconductor material may be constrained to some predetermined target to arrive at a desired final hetero-fin height. In some exemplary embodiments, the third sub-fin III-V semiconductor material is grown to a thickness no more than 100 nm and advantageous 50 nm, or less.

With the sub-fin grown, method 201 continues at operation 250 where feed gases and potentially other epitaxial process control parameters (e.g., temperature, partial pressures, etc.) are changed again to epitaxially grow a III-V fin material layer from a surface of the third III-V sub-fin material layer contained within the trench. This forms the active fin material from a surface of the undoped portion of the III-V sub-fin still contained within the trench. Operations 240 and 250 may be performed in a continuous manner with an in-situ change in growth parameters. In some embodiments, operation 250 entails epitaxially growing a fourth thickness of III-V semiconductor material such as GaAs, GaAsSb, AlAsSb, InAs, InGaAs, InAlAs, InAlGaAs, AlGaAs, InP, GaP, AlAs, or InGaP. In some exemplary embodiments, the III-V material grown at operation 250 is associated with a larger vacuum electron affinity than does the III-V material grown at operation 240, resulting in a conduction band offset. In some embodiments, III-V material grown at operation 250 has a narrower band gap than that of the III-V material grown at operation 240 (i.e., a type-I band offset). For example, where GaAs, InGaAs, AlGaAs, or InP is grown at operation 240, an InGaAs alloy (e.g., $In_{0.53}Ga_{0.47}As$) is grown at operation 250. In advantageous embodiments, operation 250 is performed without intentional doping, to grow III-V material with lowest possible impurity doping. Such a material has an advantageously high carrier (electron) mobility and low leakage current (with the charge carrier blocking CBO from the sub-fin III-V material). The fin III-V semiconductor material may be grown to a wide range of thicknesses as the material may be employed to provide a fin volume in which the active device region is to reside. Thicknesses of the fin III-V semiconductor material may be constrained to some predetermined target to arrive at a desired final hetero-fin height. In some exemplary embodiments, the third sub-fin III-V semiconductor material is grown to a thickness no more than 60 nm and advantageously 50 nm, or less.

Figure 3D:
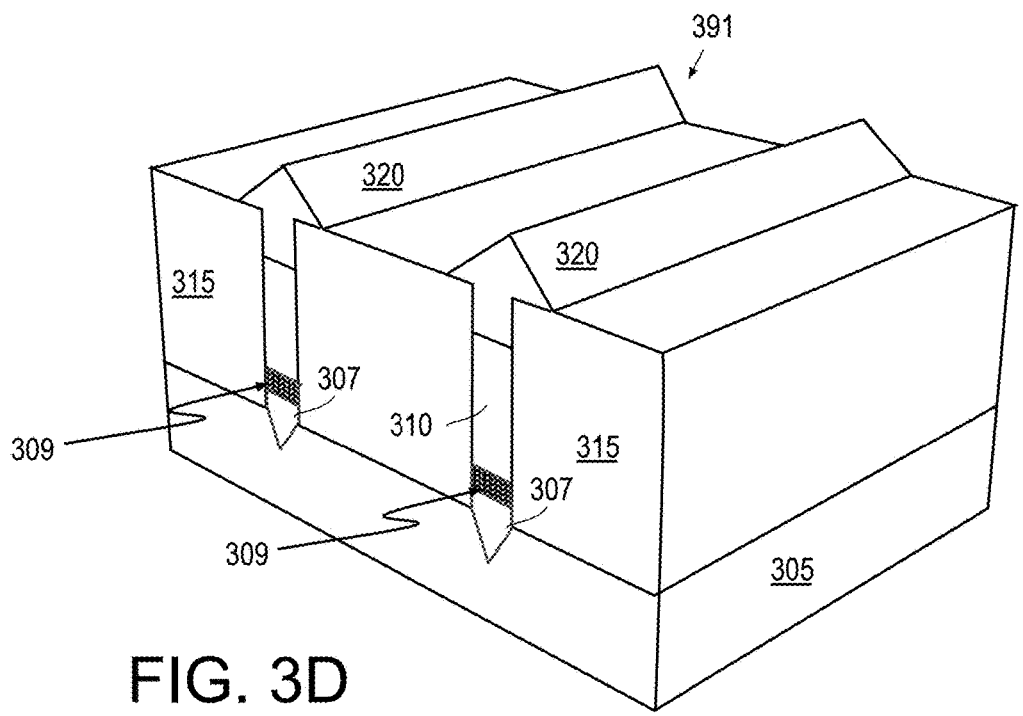

FIG. 3D further illustrates an exemplary structure following epitaxial fin growth operations 220-250. As shown, III-V hetero-fins 391 include a first III-V sub-fin layer 307, which may be counter-doped or not, proximal to, adjacent to, or near substrate 305. Hetero-fins 391 further include a substantially undoped second III-V sub-fin layer 309 disposed over sub-fin layer 307. The heterojunction between sub-fin layers 307 and 309 is therefore to function as the silicon diffusion barrier as described above, maintaining a lower level of silicon contamination within third sub-fin III-V material layer 310, and/or fin III-V material layer 320.

Returning to FIG. 2, method 201 continues at operation 260 where the III-V fin material is planarized with the surrounding field dielectric material using any known technique(s). The field dielectric material is then recessed to a desired level to expose sidewalls of III-V fin material. In the exemplary embodiment illustrated in FIG. 3E, dielectric material 315 is recess etched to expose more or less of hetero-fins 391. In the illustrative embodiment, dielectric material 315 is recessed sufficiently to expose at least a majority of fin III-V material 320, and more advantageously substantially all over fin material 320. In further embodiments, no sub-fin material 310 is exposed. In exemplary embodiments, III-V hetero-fins 391 have a maximum sidewall z-height $H_3$ of 20-80 nm. As further illustrated, the sub-fin, including narrower band gap III-V sub-fin layers 307 and 310 separated by a wider band gap III-V sub-fin layer 309, extends a maximum z-height $H_2$ from an interface with substrate 305. In some exemplary embodiments where a lateral CD of hetero-fin 391 is between 10-50 nm, sub-fin height $H_2$ is between 200 and 250 nm. In some further embodiments, III-V sub-fin layer 307 has a z-thickness $H_1$ that is no more than 10% of sub-fin height $H_2$. In exemplary embodiments where sub-fin height $H_2$ is between 200 and 250 nm, III-V sub-fin layer 307 has a maximum z-thickness $H_1$ of 20-50 nm. In some further embodiments, III-V sub-fin layer 309 has a z-thickness $H_4$ that is no more than 50% of sub-fin height $H_2$. In exemplary embodiments where sub-fin height $H_2$ is between 200 and 250 nm, III-V sub-fin layer 309 has a maximum z-thickness $H_4$ of 50-100 nm.

Returning to FIG. 2, method 201 continues with fabricating a FET from each hetero-fin. Any known finFET process may be employed, including both gate-first and gate-last techniques. For an exemplary gate-last embodiment, a sacrificial gate formation and replacement process is performed at operation 270. In general, a gate stack mandrel is formed over a channel region of the exposed III-V fin. Any known sacrificial gate structure and fabrication techniques may be employed. For example, a sacrificial gate material may be formed over III-V fin material using any conventional technique. Sacrificial gate material can be formed on at least two sidewalls of fin material and land on adjacent field dielectric material. Gate spacer dielectric may also be formed using any conventional technique. Subsequent to forming the gate mandrel, doped regions are formed at the source/drain ends of the III-V semiconductor fin material.

A pair of source/drain regions may be formed by depositing a heavily doped semiconductor of any suitable composition. In some embodiments, an epitaxial process is employed to form monocrystalline source/drain regions. An interlayer dielectric (ILD) may be deposited over source/drain regions and planarized with the gate mandrel. The gate mandrel is then removed selectively relative to the surrounding dielectric material, exposing fin material. A gate stack is then formed over at least two sidewalls of the III-V fin material. Method 201 is then completed with backend metallization including source/drain contact metals interconnecting the plurality of NMOS III-V finFETs into an IC, for example a CMOS IC further including PMOS transistors. In some embodiments, the PMOS transistors (e.g., finFETs) are silicon-channel devices and there is no equivalent concern associated with substrate silicon doping. In some alternative embodiments, the PMOS transistors (e.g., finFETs) each include a III-V semiconductor channel between p-type source/drain region and disposed over a sub-fin of III-V semiconductor material substantially free of the non-silicon impurities since substrate silicon doping of the sub-fin will tend to dope the sub-fin n-type, tending to improve electrical isolation.

Figure 3E:
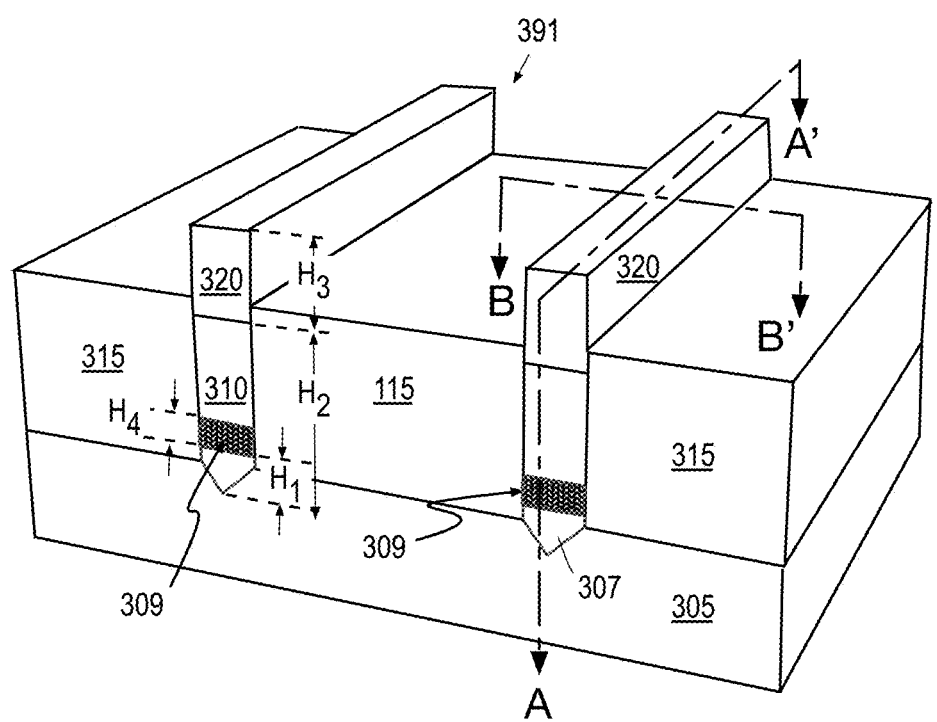
Figure 4A:
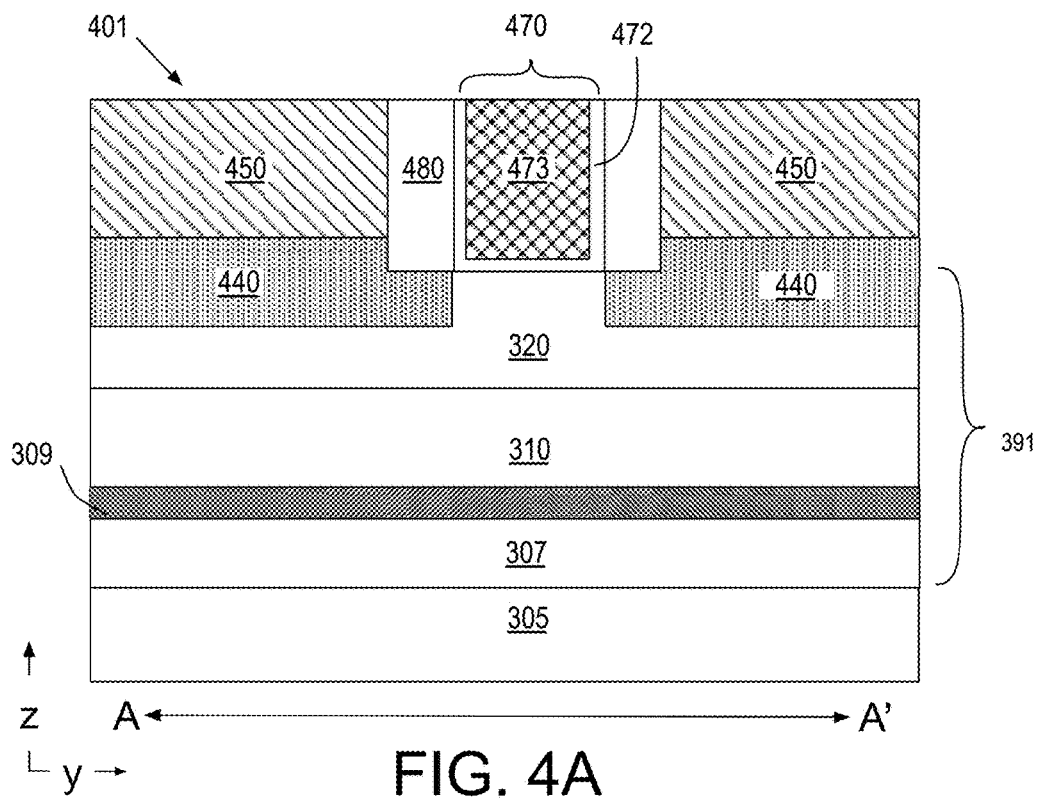
FIG. 4A illustrates a cross-sectional view through a length of a channel region and source/drain regions of a high mobility finFET employing the III-V structure illustrated in FIG. 3E, in accordance with some embodiments.
Figure 4B:
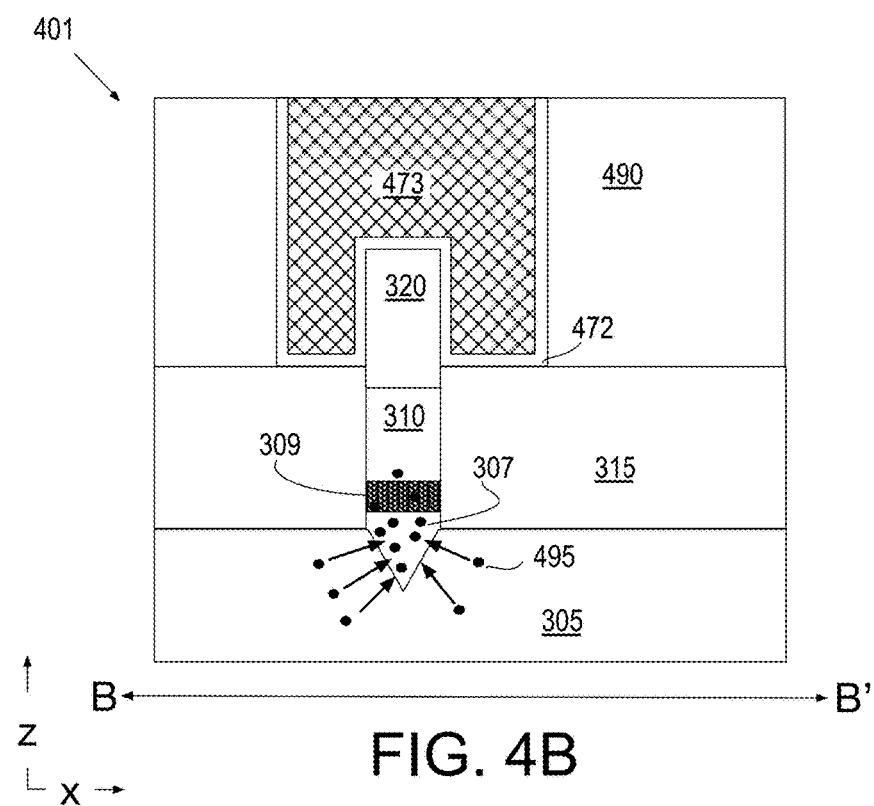
FIG. 4B illustrates a cross-sectional view through a width of a channel region and a gate electrode of the high mobility finFET depicted in FIG. 4A, in accordance with some embodiments.

FIG. 4A illustrates a cross-sectional view through a length of a channel region and source/drain regions of a III-V finFET 401 along the A-A' line depicted in FIG. 3E, in accordance with some embodiments. FIG. 4B illustrates a cross-sectional view through a width of a channel region and a gate electrode of III-V finFET 401 along the B-B' line depicted in FIG. 3E, in accordance with some embodiments. Transistor 401 includes a monocrystalline III-V hetero-fin 391 having a minimum lateral CD a first dimension (e.g., x) and a longer lateral CD in a second dimension (e.g. y). An active device region including a channel region is disposed within fin material 320.

Transistor 401 includes a channel region covered by a gate stack 470 including a gate dielectric 472 and gate electrode 473. The channel region is to be modulated through the field effect applied by an overlying gate electrode 473. While any known gate stack materials may be utilized, in one exemplary embodiment gate dielectric 472 is a high-k material with a bulk relative dielectric constant of 9, or more (e.g., $Al_2O_3$, $HfO_2$, etc.). Gate electrode 473 may include any metal with a work function suitable for the III-V alloy of fin material 320. The channel region is further disposed between a pair of heavily doped III-V semiconductor source/drains 440. III-V semiconductor source/drains may be of a different alloy than that of the channel and doped, for example, to at least 1e19 donor impurity atoms/$cm^3$. Doped source/drain material 440 may be any material suitable for ohmic contact to fin material 320, such as, but not limited to, InAs. In some embodiments, source/drain material 440 is single crystalline. Metal source/drain contacts 450 are in contact with doped source/drain material 440 and are electrically isolated from gate stack 470 by interlayer dielectric 480 and/or lateral spacers of gate dielectric 472.

Transistor 401 includes a sub-fin of three or more III-V semiconductor materials disposed between the fin 320 and silicon substrate 305. Following the various thermal processes associated with fabricating transistor 401 (including backend interconnect metallization), sub-fin III-V material layer 307 proximal to substrate 305 and distal from the active region comprises a higher concentration of silicon impurities than does sub-fin III-V material layer 310 proximal to the active region and distal from substrate 305, due to at least in part intervening sub-fin III-V material layer 309 having a CBO. As further illustrated in FIG. 4B, silicon atoms 495 thermally diffuse from substrate 305, and enter III-V material of first sub-fin layer 307, becoming confined there by the presence of sub-fin III-V material layer 309.

In some embodiments, after IC manufacture, the concentration of silicon impurities at an interface with substrate 305 (e.g., at least 1e19 atoms/cm3) is at least an order of magnitude higher than the concentration of silicon impurities within sub-fin layer 310 at an interface of fin 320 (e.g., less than 1e18 atoms/$cm^3$). For these exemplary embodiments, concentration of silicon impurities within fin material 320 is below 1e18 atoms/$cm^3$. Depending on the technique, the concentration of silicon impurities within fin material 320 may be undetectable (i.e., below detection limit of the technique). For example, APT may be unable to detect silicon in fin material 320, while Secondary Ion Mass Spectrometry (SIMS) may be able to detect silicon at some e17 atoms/$cm^3$ concentration, or lower.

As noted above, the presence of a heterojunction diffusion barrier layer in the sub-fin epitaxial stack is beneficial for many device structures beyond the finFET architecture described in the context of exemplary embodiments. For example, although the sub-fin may be at least partially sacrificial in a gate-all-around (nanowire) transistor, it is still important to control thermal diffusion of silicon into the nanowire channel during processing upstream of releasing the fin from the substrate. Therefore, a heterojunction diffusion barrier may be incorporated into a sub-fin substantially as described, but then be at least partially removed during subsequent processing.

Figure 5:
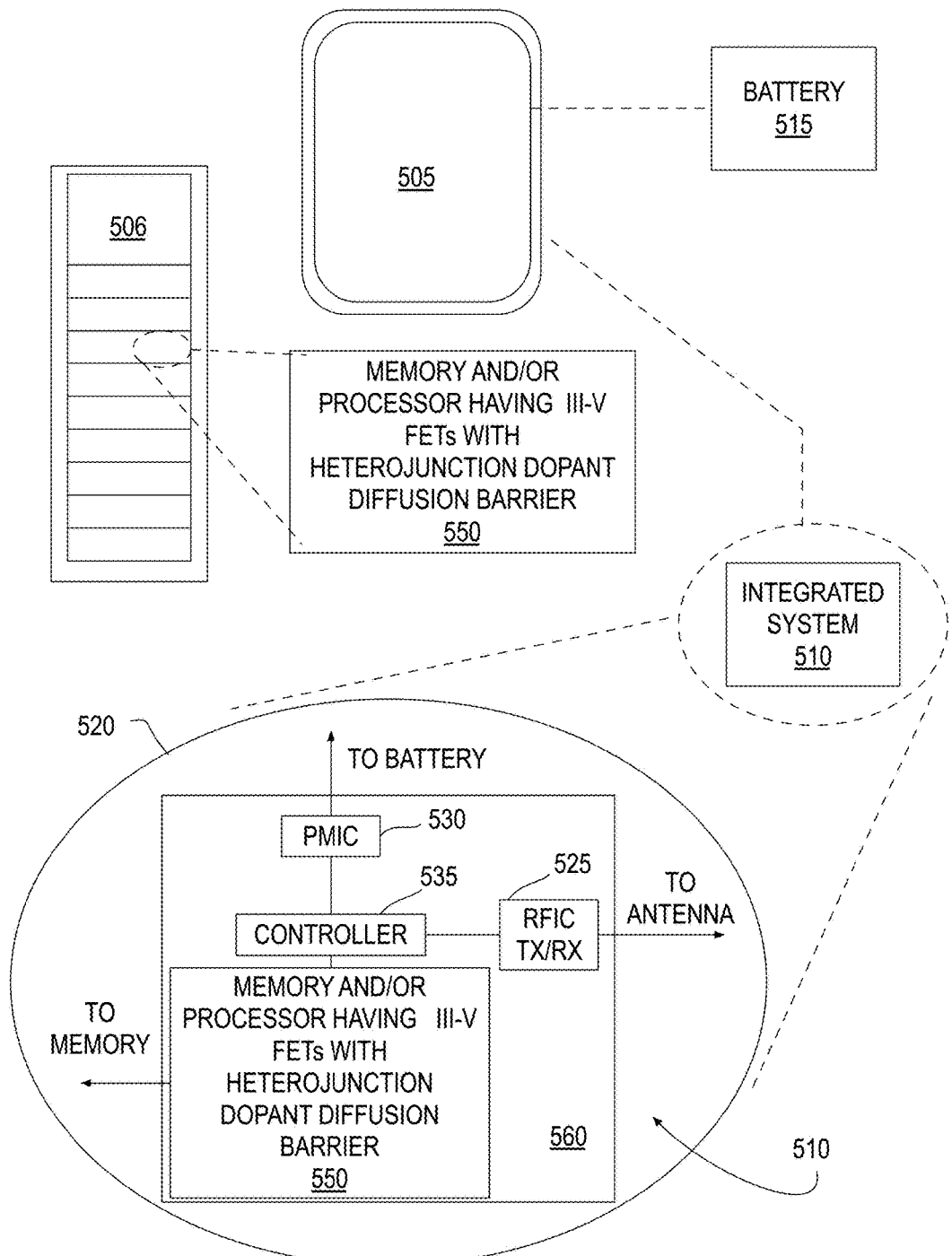
FIG. 5 illustrates a mobile computing platform and a data server machine employing an SoC including a transistor with localized sub-fin isolation, in accordance with embodiments of the present invention.

FIG. 5 illustrates a mobile computing platform and a data server machine employing an SoC including a III-V transistor with a heterojunction dopant diffusion barrier, in accordance with embodiments of the present invention. The server machine 506 may be any commercial server, for example including any number of high-performance computing platforms disposed within a rack and networked together for electronic data processing, which in the exemplary embodiment includes a packaged monolithic SoC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone packaged chip within the server machine 506, packaged monolithic SoC 550 includes a memory block (e.g., RAM), a processor block (e.g., a microprocessor, a multi-core microprocessor, graphics processor, or the like) including at least one III-V channeled finFET with a sub-fin heterojunction diffusion barrier, for example as describe elsewhere herein. The monolithic SoC 550 may be further coupled to a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535.

Functionally, PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs or integrated into monolithic SoC 550.

Figure 6:
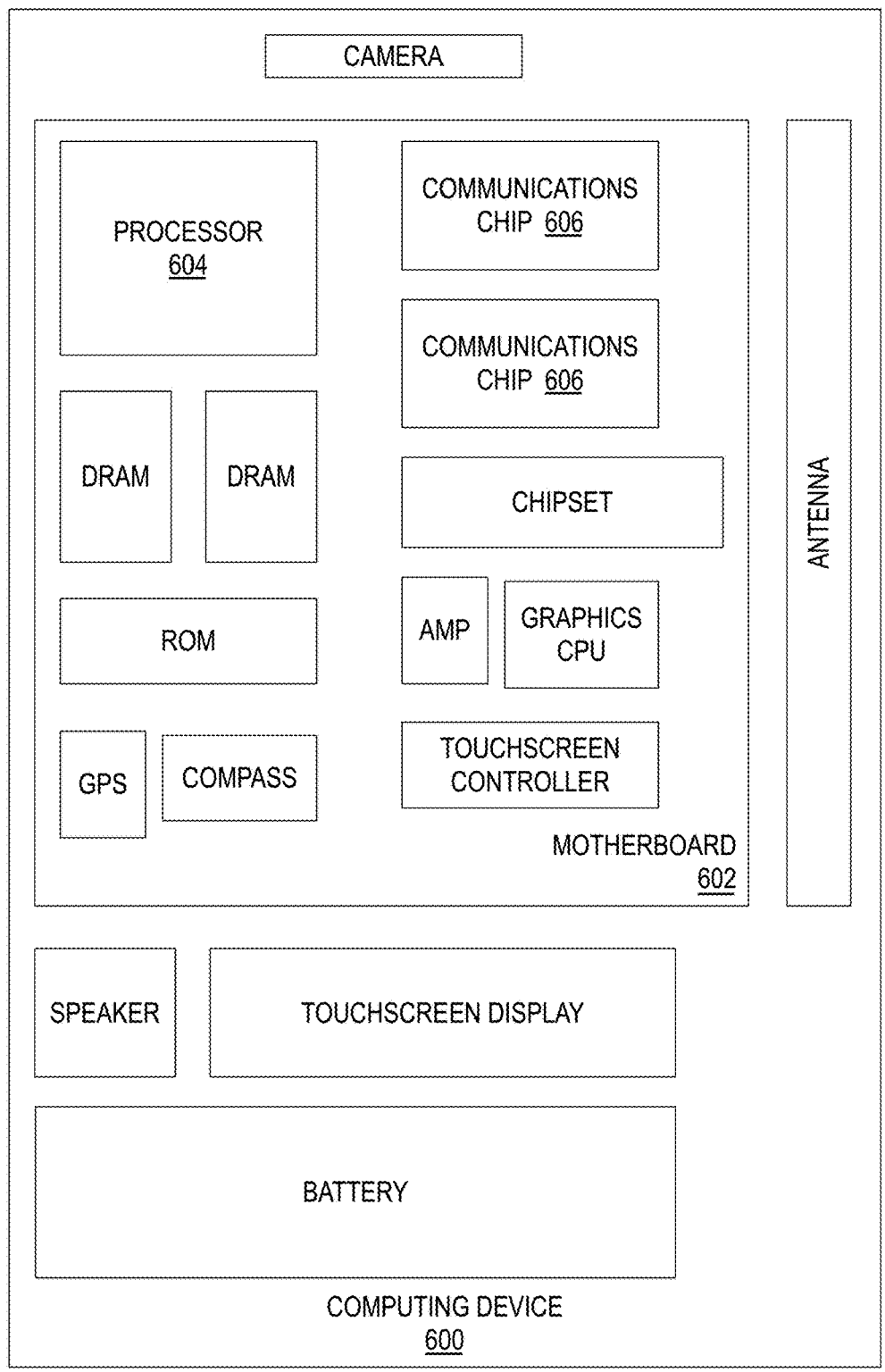
FIG. 6 is a functional block diagram of an electronic computing device, in accordance with an embodiment of the present invention.

FIG. 6 is a functional block diagram of an electronic computing device, in accordance with an embodiment of the present invention. Computing device 600 may be found inside platform 505 or server machine 506, for example. Device 600 further includes a motherboard 602 hosting a number of components, such as, but not limited to, a processor 604 (e.g., an applications processor), which may further incorporate at least one III-V semiconductor channeled finFET including a sub-fin heterojunction diffusion barrier, in accordance with embodiments of the present invention. Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below:

In one or more first embodiments, a transistor comprises an active region disposed within a III-V semiconductor fin, and a sub-fin disposed between the fin and a substrate. The sub-fin further comprises a first sub-fin layer of III-V semiconductor material disposed over the substrate, a second sub-fin layer of III-V semiconductor material disposed over the first sub-fin layer, and a third sub-fin layer of III-V semiconductor material disposed between the first and second sub-fin layers and nearer to the substrate than to the fin, wherein the third layer is of a III-V alloy composition associated a wider band gap than that of the first and second sub-fin layer.

In furtherance of the first embodiments, the III-V semiconductor fin comprises a III-V semiconductor material having a different III-V alloy composition than that of the first sub-fin layer. The wider band gap is associated with a conduction band offset (CBO) between the first and second sub-fin layers that is at least 250 meV.

In furtherance of the first embodiments, the change in III-V alloy composition between the first and second sub-fin layers occurs over a material thickness of no more than 10 nm.

In furtherance of the first embodiments, the third sub-fin layer material has a CBO from both the first and second sub-fin layer materials.

In furtherance of the first embodiments immediately above, the CBO is at least 250 meV.

In furtherance of the first embodiments, the first and second sub-fin layer materials have substantially the same III-V alloy composition.

In furtherance of the first embodiments, the active region comprises a channel region of III-V semiconductor material disposed between a pair of semiconductor source/drain regions doped to a same conductivity type. A gate electrode is disposed over the channel region, and a pair of source/drain contacts are coupled to the pair of source/drain regions.

In furtherance of the first embodiments, the sub-fin extends a height from an interface with the substrate, the first sub-fin layer extends from the interface to no more than 10% of the sub-fin height.

In furtherance of the first embodiments, the sub-fin extends to a z-height from the interface with the substrate of 200-250 nm, and the sub-fin layer has a z-thickness of 20-100 nm.

In furtherance of the first embodiments, the first sub-fin layer is doped with a higher concentration of one or more acceptor impurities than is present in at least the second sub-fin layer.

In furtherance of the first embodiments, a concentration of the acceptor impurities is over 1e18 atoms/cm$^3$ within the first sub-fin layer, and a concentration of the donor impurities is below 1e18 atoms/cm$^3$ within the second sub-fin layer.

In furtherance of the first embodiments, at least one of the first and second sub-fin layers comprise a first of GaAs, GaAsSb, AlAsSb, InAs, InGaAs, InAlAs, InAlGaAs, AlGaAs, InP, GaP, AlAs, or InGaP. The third sub-fin layer comprises a second of GaAs, GaAsSb, AlAsSb, InAs, InGaAs, InAlAs, InAlGaAs, AlGaAs, InP, GaP, AlAs, or InGaP. The fin comprises a third of GaAs, GaAsSb, AlAsSb, InAs, InGaAs, InAlAs, InAlGaAs, AlGaAs, InP, GaP, AlAs, or InGaP.

In one or more second embodiments, a device including integrated circuitry comprises a plurality of n-type transistors, each including a channel region in a III-V semiconductor fin disposed between a pair of semiconductor source/drain regions, a gate electrode disposed over the channel region, and a pair of source/drain contacts coupled to the pair of source/drain regions. A sub-fin is disposed between the fin and a silicon substrate. The sub-fin further comprises a first sub-fin layer of III-V semiconductor material disposed over the substrate. A second sub-fin layer of III-V semiconductor material disposed over the first sub-fin layer. A third sub-fin layer of III-V semiconductor material disposed between the first and second sub-fin layers and nearer to the substrate than to the fin, wherein the third layer is of a III-V alloy composition associated with a band gap having a conduction band offset (CBO) from that of the first sub-fin layer-fin proximal to the active region and distal from the substrate. The device further comprises a plurality of p-type transistors electrically coupled to the plurality of n-type transistors.

In furtherance of the second embodiments, the plurality of p-type transistors each include active regions comprising a group IV semiconductor material.

In furtherance of the second embodiments, the plurality of p-type transistors each include an active region disposed within a III-V semiconductor fin, and a sub-fin comprising fewer than three material layers disposed between the fin and the substrate.

In one or more third embodiments, a method of forming a transistor comprises receiving a substrate, epitaxially growing a first thickness of III-V semiconductor material over a seeding surface of the substrate, epitaxially growing a second thickness III-V semiconductor material over the first thickness, epitaxially growing a third thickness of III-V semiconductor material over the second thickness, wherein the third thickness is of a III-V alloy composition associated with a band gap wider than that of the first thickness, and wherein the first thickness is less than the third thickness, and forming an active region of the transistor in a fourth thickness of III-V semiconductor material separated from the substrate by the first, second and third thicknesses of III-V semiconductor material.

In furtherance of the third embodiments, the method further comprises embedding the first, second, and third thicknesses within a field dielectric material, patterning the fourth thickness into a fin extending above the filed dielectric material, and forming a gate stack and pair of source/drain regions in the fin.

In furtherance of the third embodiments immediately above, embedding the first, second and third thicknesses further comprises forming a trench in the field dielectric material, the trench exposing a crystalline surface of the substrate. Growing the first thickness of III-V semiconductor material further comprises growing a first III-V semiconductor material within the trench. Growing the second thickness of III-V semiconductor material further comprises growing a second III-V semiconductor material within the trench having a conduction band offset from the first III-V semiconductor material that is at least 250 mV. Growing the third thickness of III-V semiconductor material further comprises growing the first III-V semiconductor material within the trench.

In furtherance of the third embodiments, growing the first thickness of III-V semiconductor material further comprises growing the first III-V semiconductor material within the trench to a thickness less than 50 nm. Growing the second thickness of III-V semiconductor material further comprises growing the second III-V semiconductor material within the trench to a thickness less than 50 nm. Growing the third thickness of III-V semiconductor material further comprises growing the first III-V semiconductor material within the trench to a thickness of at least 50 nm.

In furtherance of the third embodiments, growing the first and second thicknesses of III-V semiconductor material further comprises compositionally grading from the first III-V semiconductor material to the second III-V semiconductor material over a material thickness of no more than 10 nm.

In furtherance of the third embodiments, growing the first III-V semiconductor material further comprises growing a first of GaAs, GaAsSb, AlAsSb, InAs, InGaAs, InAlAs, InAlGaAs, AlGaAs, InP, GaP, AlAs, or InGaP. Growing the second III-V semiconductor material further comprises growing a second of GaAs, GaAsSb, AlAsSb, InAs, InGaAs, InAlAs, InAlGaAs, AlGaAs, InP, GaP, AlAs, or InGaP. Forming the active region further comprises growing the fourth thickness of III-V semiconductor material comprising a third of GaAs, GaAsSb, AlAsSb, InAs, InGaAs, InAlAs, InAlGaAs, AlGaAs, InP, GaP, AlAs, or InGaP.

In furtherance of the third embodiments, forming the transistor further comprises planarizing the field dielectric material with a surface of the fourth thickness of III-V semiconductor material, recessing the field dielectric material to expose sidewalls of the fourth thickness of III-V semiconductor material, forming a gate stack over a channel region of the fourth thickness of III-V semiconductor material, and forming a pair of source/drain regions electrically coupled to opposite ends of the channel region.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor, comprising:
   an active region within a III-V semiconductor fin; and
   a sub-fin between the fin and a substrate, wherein the sub-fin further comprises:
      a first sub-fin layer of III-V semiconductor material over the substrate;
      a second sub-fin layer of III-V semiconductor material over the first sub-fin layer, wherein the second sub-fin layer is doped with a lower concentration of one or more acceptor impurities than is present in at least the first sub-fin layer; and
      a third sub-fin layer of III-V semiconductor material between the first and second sub-fin layers, wherein the third layer is of a III-V alloy composition associated with a wider band gap than that of the first and second sub-fin layers.

2. The transistor of claim 1, wherein:
   the III-V semiconductor fin comprises a III-V semiconductor material having a different III-V alloy composition than that of the first sub-fin layer; and
   the wider band gap is associated with a conduction band offset (CBO) between the first and second sub-fin layers that is at least 250 meV.

3. The transistor of claim 1, wherein the change in III-V alloy composition between the first and third sub-fin layers occurs over a material thickness of no more than 10 nm.

4. The transistor of claim 1, wherein:
   the third sub-fin layer material has a conduction band offset (CBO) from both the first and second sub-fin layer materials.

5. The transistor of claim 4, wherein the CBO is at least 250 meV.

6. The transistor of claim 5, wherein:
   the first and second sub-fin layer materials have substantially the same III-V alloy composition.

7. The transistor of claim 1, wherein the active region comprises a channel region of III-V semiconductor material between semiconductor source and drain regions doped to a same conductivity type; and
wherein:
   a gate electrode is over the channel region; and
   a pair of source and drain contacts are coupled to the source and drain regions.

8. The transistor of claim 1, wherein:
   the sub-fin extends a sub-fin height from an interface with the substrate; and
   the first sub-fin layer extends from the interface to no more than 10% of the sub-fin height.

9. The transistor of claim 1, wherein:
   the sub-fin extends to a sub-fin height from an interface with the substrate of 200-250 nm; and
   the third sub-fin layer has a thickness of 50-100 nm.

10. The transistor of claim 1, wherein
    a concentration of the acceptor impurities is over 1e18 atoms/cm$^3$ within the first sub-fin layer; and
    a concentration of the acceptor impurities is below 1e18 atoms/cm$^3$ within the second sub-fin layer.

11. The transistor of claim 1, wherein:
    at least one of the first and second sub-fin layers comprise a first of GaAs, GaAsSb, AlAsSb, InAs, InGaAs, InAlAs, InAlGaAs, AlGaAs, InP, GaP, AlAs, or InGaP;
    the third sub-fin layer comprises a second of GaAs, GaAsSb, AlAsSb, InAs, InGaAs, InAlAs, InAlGaAs, AlGaAs, InP, GaP, AlAs, or InGaP; and
    the fin comprises a third of GaAs, GaAsSb, AlAsSb, InAs, InGaAs, InAlAs, InAlGaAs, AlGaAs, InP, GaP, AlAs, or InGaP.

12. A device including integrated circuitry, comprising:
    a plurality of n-type transistors, each of the transistors including:
       an active region in a III-V semiconductor fin between source and drain regions;
       a gate electrode over at least a portion of the active region; and
       source and drain contacts coupled to the source and drain regions, wherein:
          a sub-fin is between the fin and a silicon substrate, the sub-fin extending a sub-fin height from an interface with the substrate, and the sub-fin further comprising:
             a first sub-fin layer of III-V semiconductor material over the substrate, wherein the first sub-fin layer extends from the interface to no more than 10% of the sub-fin height;
             a second sub-fin layer of III-V semiconductor material over the first sub-fin layer; and
             a third sub-fin layer of III-V semiconductor material between the first and second sub-fin layers, wherein the third layer is of a III-V alloy composition associated with a band gap having a conduction band offset (CBO) from that of the first sub-fin layer; and
    a plurality of p-type transistors electrically coupled to the plurality of n-type transistors.

13. The device of claim 12, wherein the CBO is at least 250 meV.

14. The device of claim 12, wherein the first and second sub-fin layer materials have substantially the same III-V alloy composition.

15. The device of claim 12, wherein the second sub-fin layer is doped with a lower concentration of one or more acceptor impurities than is present in at least the first sub-fin layer.

16. The device of claim 12, wherein the sub-fin height is 200-250 nm; and
    the third sub-fin layer has a thickness of 50-100 nm.

17. The device of claim 12, wherein:
    the substrate comprises crystalline silicon;
    the first and second sub-fin layers comprises at least Ga and As;
    the third sub-fin layer comprises a III-V alloy that comprises at least Al and As; and
    the first sub-fin layer comprises more silicon than the second sub-fin layer.

18. The transistor of claim 1, wherein:
    the substrate comprises crystalline silicon;
    the first and second sub-fin layers comprises at least Ga and As;
    the third sub-fin layer comprises a III-V alloy that comprises at least Al and As; and
    the first sub-fin layer comprises more silicon than the second sub-fin layer.

* * * * *